United States Patent [19]

Tokita et al.

[11] Patent Number: 5,103,422
[45] Date of Patent: Apr. 7, 1992

[54] THREE-DIMENSIONAL MAGNETIC MEMORY MEDIUM AND METHOD FOR INITIAL SETTING THEREOF

[75] Inventors: Toshiaki Tokita, Yokohama; Motoharu Tanaka, Mishima; Hajime Yuzurihara, Yokohama, all of Japan

[73] Assignee: Ricoh Compnay, Ltd., Tokyo, Japan

[21] Appl. No.: 277,139

[22] Filed: Nov. 29, 1988

[30] Foreign Application Priority Data

Dec. 2, 1987 [JP] Japan ................................ 62-305461
Apr. 19, 1988 [JP] Japan ................................ 63-97125
Apr. 28, 1988 [JP] Japan ................................ 63-107324
Jul. 27, 1988 [JP] Japan ................................ 63-187384
Oct. 4, 1988 [JP] Japan ................................ 63-250319

[51] Int. Cl.⁵ .............................................. G11C 19/08
[52] U.S. Cl. .................................. 365/32; 365/38; 365/173
[58] Field of Search ............... 365/32, 36, 38, 171, 365/173

[56] References Cited

U.S. PATENT DOCUMENTS 4,052,711 10/1977 Lin et al. ........................... 365/32

OTHER PUBLICATIONS

M. Kaneko et al., "Optical Operation of a Magnetic Bubble", IEEE Transactions on Magnetics, vol. MAG-22, No. 1, pp. 188-196, Jan. 1986.

*Primary Examiner*—Joseph A. Popek
*Attorney, Agent, or Firm*—Cooper & Dunham

[57] ABSTRACT

A three-dimensional magnetic memory medium which comprises a substrate, a plurality of magnetic layers and a plurality of nonmagnetic layers. The magnetic layers and the nonmagnetic layers are alternately stacked one above the other on the substrate. Each magnetic layer comprises a transfer area, wherein assuming that n is a positive even whole number, the (n−1)th magnetic layer (the 3rd layer, the 5th layer, the 7th layer, . . .) has a transfer pattern different from that of the nth magnetic layer (the 2nd layer, the 4th layer, the 6th layer, . . .). An uppermost magnetic layer is used as a signal writing area and as a signal reading area. A position corresponding to a signal "1" and a position corresponding to a signal "0" are arranged in the signal writing area at a position superposed on a position of "1" and on a position of "0" in a transfer pattern of the (n−1)th magnetic layer, respectively. A guide line is provided in the signal writing area so that a magnetic bubble is movable between the position of a signal "1" and the position of a signal "0" along the guide line.

11 Claims, 15 Drawing Sheets

——————— 1st LAYER
- - - - - - - 2nd LAYER
·············· 3rd LAYER

Fig. 18(a)    Fig. 19(a)
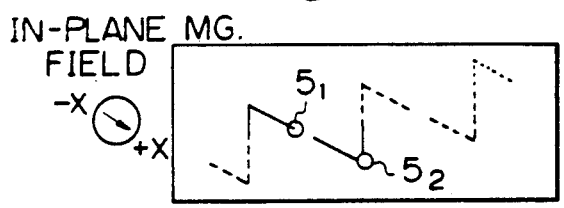    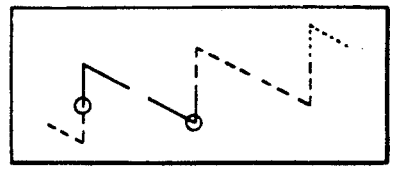
Fig. 18(b)    Fig. 19(b)
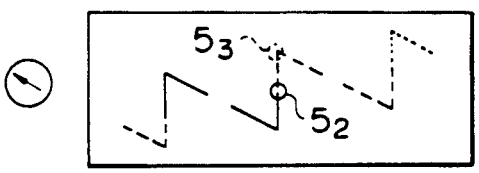    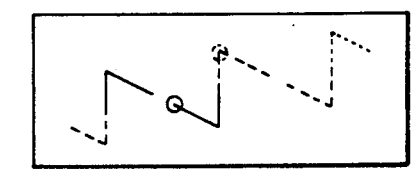
Fig. 18(c)    Fig. 19(c)
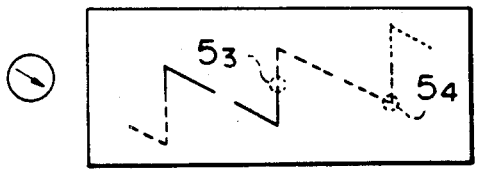    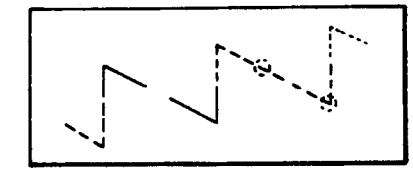
Fig. 18(d)    Fig. 19(d)
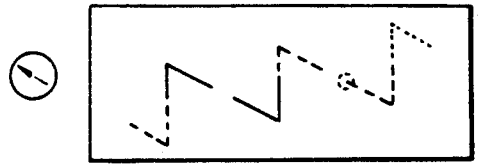    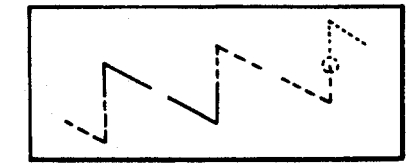

Fig.22(a)  Fig.22(b)  Fig.22(c)  Fig.22(d)
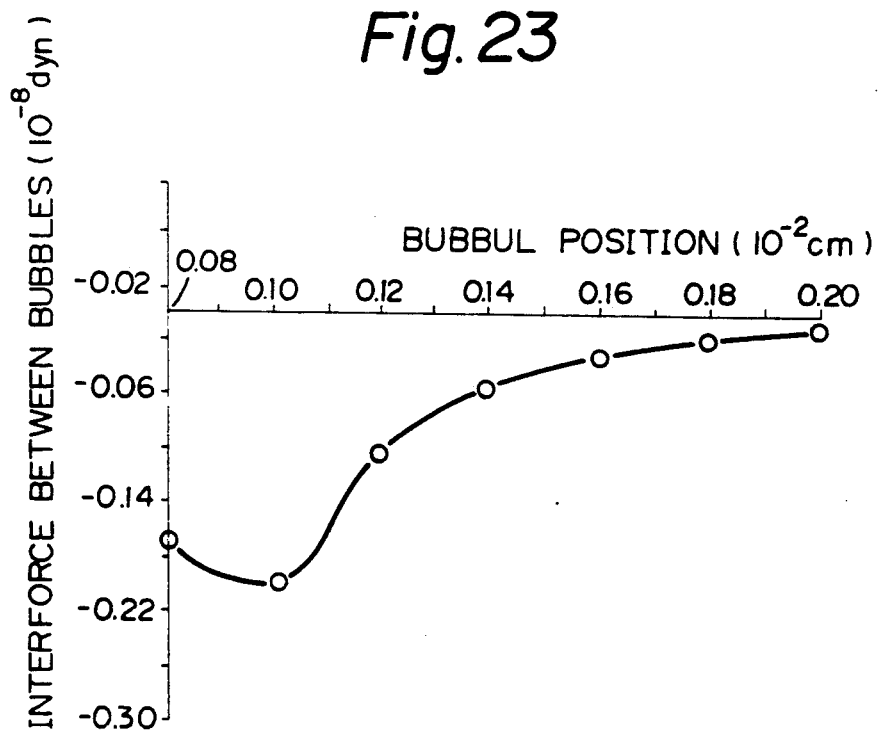
Fig. 23

THREE-DIMENSIONAL MAGNETIC MEMORY MEDIUM AND METHOD FOR INITIAL SETTING THEREOF

BACKGROUND OF THE INVENTION

The present invention relates to a magnetic memory medium having a three-dimensional structure aiming super high density of information memorized in a magnetic bubble memory device and a method for setting an initial state of the magnetic memory medium.

In general, in an outside memory equipment of a large computer system which utilizes a magnetic bubble memory device, signals (magnetic bubbles) are transferred along a transfer pattern by applying an in-plane magnetic field, so that a high reliability of memorization is realized due to the fact that the number of the mechanically driven elements is small and the bubble is non-volatile. However, in these days, the magnetic bubble memory medium has been required to memorize information in higher density than before and to reduce the access time to process data in higher speed than before. In order to achieve the requirement of realizing a magnetic bubble memory medium of high memory density, it is necessary to form each magnetic bubble diameter in a very small size such as in a submicron dimension (less than 1 μm) and arrange fine transfer patterns in high density in order to match with the minute magnetic bubble. However, the bubble transfer margin is reduced and the access time is prolonged according as the bubble diameter becomes small. Therefore, the high density arrangement of the magnetic bubbles in a plane is limited.

SUMMARY OF THE INVENTION

The present invention was made considering the above mentioned problems. It is therefore an object of the present invention to provide a magnetic memory medium and a method for initial setting thereof in which the memory density is extraordinarily expanded and the access speed is very heightened by adopting a novel three dimensional structure of the memory medium in which data is recorded and transferred not only in a plane of the magnetic layer but also in a direction perpendicular to the plane of the magnetic layer instead of adopting the conventional two dimensional memory medium in which the heightening of the memory density is limited as mentioned above.

The object of the invention is achieved by a three dimensional magnetic memory medium in accordance with the present invention which is characterized in that the magnetic memory medium comprises a substrate and a plurality of magnetic layers and non-magnetic layers which are alternately stacked one above the other on the substrate, each of the non-magnetic layers having a transfer portion in which, assuming n as a positive even number, the (n−1)th magnetic layer (the third layer, the fifth layer, the seventh layer, . . .) has a transfer pattern different from that of the nth magnetic layer (the second layer, the fourth layer, the sixth layer, . . .), the uppermost magnetic layer being used as a writing area and as a reading area for writing and reading data signals, the position of signal "1" and the position of signal "0" in the transfer pattern of the uppermost magnetic layer being superposed on the position of signal "1" and position of signal "0" of the transfer pattern of the (n−1)th magnetic layer, respectively, and in which a guide line is provided in the writing area of the uppermost magnetic layer so that the magnetic bubble is able to move between the position "1" and the position "0" of the writing area of the uppermost magnetic layer.

Advantages of the above mentioned present invention are that extraordinary high density of the magnetic medium can be realized and that the access speed can be heightened, due to the three dimensional structure of the magnetic memory medium in accordance with the present invention.

Also, data signals can be written simply by transferring magnetic bubbles instead of creating new signal bubbles as in the case of the prior art magnetic bubble memory medium. Writing of the data signals can be conducted by laser irradiation or by applying an electric current to a heating resistor element or a zigzag conductor so as to transfer the magnetic bubbles to write information data signal, thus achieving a high speed data processing.

Also, the data processing speed is further heightened by utilizing a photo magnetic means to read the memorized information data signal, since it becomes unnecessary to move the magnetic bubbles to the reading area of the memory medium.

Further objects and advantages of the present invention will be apparent from the following description of the preferred embodiments of the invention as illustrated in the accompanying drawings.

BRIEF DESCRIPTION OF THE DRAWINGS

FIGS. 18(a) to 18(d) are explanatory views for explaining the magnetic function of the magnetic memory medium of the present invention for transferring the magnetic bubble in the structure of FIG. 17;

FIGS. 19(a) to 19(d) are further explanatory views for explaining the magnetic function of the magnetic memory medium of the present invention for transferring the magnetic bubble in the structure of FIG. 17;

FIGS. 22(a) to 22(d) are explanatory views for explaining how the signal is transferred from one area of the memory medium to another area thereof through a species magnetic bubble in the joint area of FIG. 21;

FIG. 23 is a graphical view for representing interforce between the species bubble of FIG. 22 and the magnetic bubble to which the signal is transferred from the species bubble;

DESCRIPTION OF THE PREFERRED EMBODIMENTS

The present invention is described hereinafter with reference to the drawings.

Figure 1:
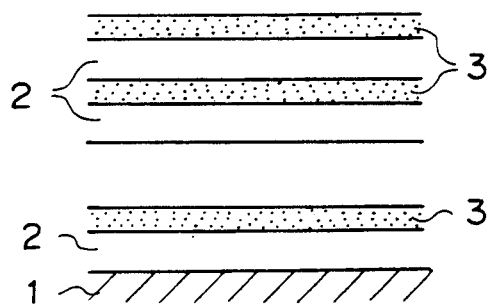
FIG. 1 is an explanatory view of an example of a three dimensional magnetic memory medium in accordance with the present invention.

FIG. 1 illustrates schematically an embodiment of the three dimensional magnetic memory medium in accordance with the present invention. As illustrated in the drawing, the memory medium comprises a substrate 1 on which a plurality of magnetic layers 2 and a plurality of nonmagnetic layers (barrier layers) 3 are alternately stacked one above the other. The lowermost magnetic layer is in contact with the substrate 1. In accordance with the present invention, the substrate 1 is made from glass, mono-crystal of GGG or plastic such as PMMA. The material of the substrate is selected according to the magnetic layer structure and the producing method thereof. Also, the magnetic layer 2 may comprise, for example, a conventional garnet film for the magnetic bubble memory or an amorphous alloy film composed of a rare earth metal and a transition metal. The nonmagnetic layer 3 comprises, for example, an $SiO_2$ film or an $Si_3N_4$ film. These magnetic layers 2 and nonmagnetic layers 3 are alternately stacked on the substrare by a sputtering method, a liquid phase epitaxial method or any other appropriate thin film deposition method. Thickness h of each magnetic layer 2 is desirably 500 Å to 40 $\mu$m. Whereas thickness of each nonmagnetic layer 3 is 50 Å to 3000 Å. The number of the layers to be stacked is determined according to the structure of the memory device.

Figure 2:
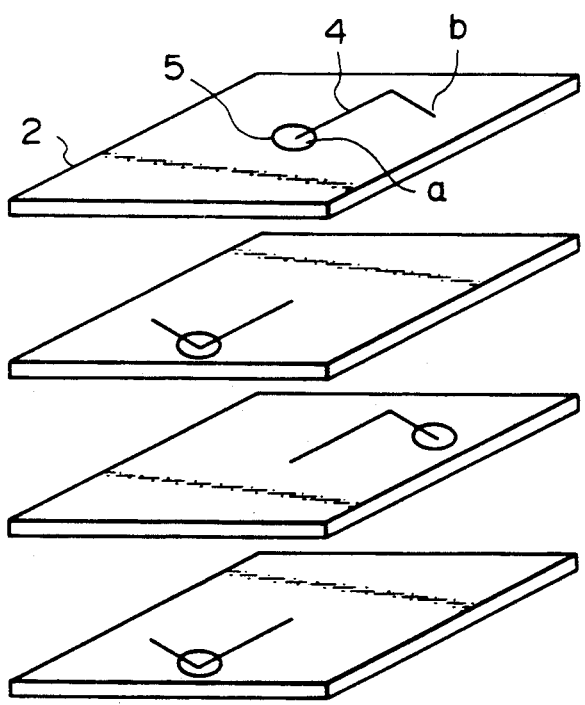
FIG. 2 is an explanatory view for explaining the state of the bubble on the transfer pattern of each magnetic layer.

FIG. 2 illustrates a transfer pattern 4 formed on each magnetic layer 2. As shown in the drawing, assuming n as a positive even whole number, the (n−1)th layer, that is the third layer, the fifth layer, the seventh layer ..., each has a same pattern (P pattern) formed thereon. On the other hand, the second layer, the fourth layer, the sixth layer ..., each has another pattern (Q pattern) formed thereon. The reference number 5 in FIG. 2 designates a magnetic bubble. As illustrated in FIG. 2, each transfer pattern 4 has one magnetic bubble 5.

The transfer pattern 4 may be formed by ion implantation technique or by processing a soft magnetic material such as permalloy with the use of contact photolithography technique.

Two stable positions are arranged in the transfer pattern of each of the magnetic layers 2 corresponding to signals "1" and "0", respectively (designated by references a and b respectively in FIG. 2). By reversing the applying direction of the in-plane magnetic field, the magnetic bubble is moved to one of the two stable positions corresponding to the information ("1" or "0") of the magnetic bubble in the transfer pattern of the upper (or lower) magnetic layer, so that the data signal is transferred.

Figure 3A:
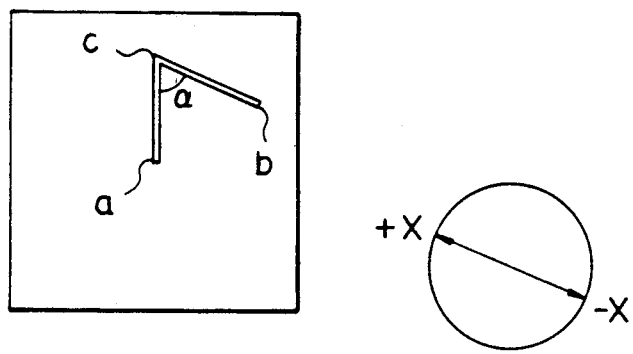
FIGS. 3(a) to 3(c) are explanatory views for explaining the function of the in-plane magnetic field for transferring the magnetic bubbles by reversing the in-plane magnetic field direction.
Figure 3B:
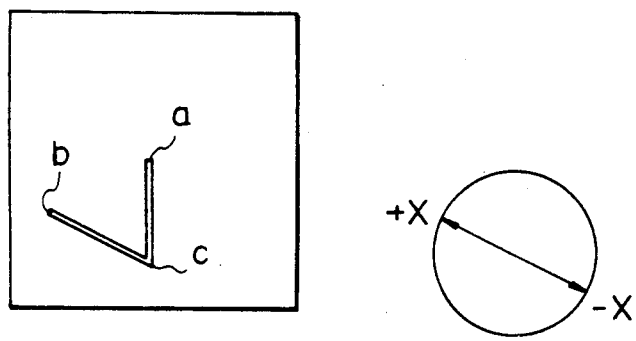
Figure 3C:
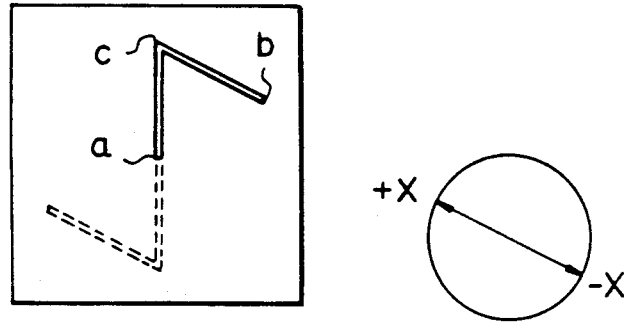

FIGS. 3(a) to 3(c) illustrate a method for transferring data signal by reversing the in-plane magnetic field direction. FIG. 3(a) shows a transfer pattern (P pattern) of the (n−1)th magnetic layer, that is the third layer, the fifth layer, the seventh layer, ..., wherein n is a positive even whole number. FIG. 3(b) shows a transfer pattern (Q pattern) of the nth magnetic layer, that is the second layer, the fourth layer, the sixth layer, ... FIG. 3(c) shows a state wherein the upper and lower magnetic layers are superposed. Each of the P pattern and the Q pattern has a position a for signal "1" and a position b for signal "0" at each end thereof. The positions a of the stacked layers are aligned in the vertical direction (perpendicular to the each layer surface) as shown in FIG. 3(c). The position a and the position b are interconnected with a corner c through a guide line, i.e., a line a-c and a line b-c, respectively, so that the positions a and b are interconnected with each other. The length of the line a-c is preferably 0.1 h to 5 h (h: thickness of the magnetic layer) so that an appropriate interforce is generated between the magnetic bubbles in any two adjacent layers stacked one above the other.

When the in-plane magnetic field is applied in the direction +X in FIGS. 3, the magnetic bubble 5 of the P pattern (FIG. 3(a)) stably positions at the position a, whereas the magnetic bubble of the Q pattern (FIG. 3(b)) stably positions at the position a or b, due to the magnetic interforce between the magnetic bubble and a magnetic pole generated in the transfer pattern 4. On the other hand, when the in-plane magnetic field is applied in the direction −X, the magnetic bubble of the P pattern moves to the position a or b and stably positions there, whereas the magnetic bubble of the Q pattern moves to the position c and stably positions there. Under the condition that the in-plane magnetic field is applied in the direction −X and that the magnetic bubble 5 of the (n−1)th layer is stably positioned at the position a, the magnetic bubble of the nth layer (the bubble being stably positioned at the position c) is acted by an attraction force from the magnetic bubble of the (n−1)th layer in addition to the magnetic attraction force due to the in-plane magnetic field, so that the magnetic bubble is stably held at the position c in a manner that the bubble center is positioned on the line a-c in the close vicinity of the position c. Therefore, from this state, by reversing the in-plane magnetic field direction to the direction +X, the magnetic bubble is transferred to the position a along the line a-c. On the other hand, when the magnetic bubble of the (n−1)th layer is stably held at the position b, the magnetic bubble of the nth layer is not acted by the magnetic attractive force from the magnetic bubble of the (n−1)th layer since the distance between the two magnetic bubbles is too far to generate an interforce therebetween. Therefore, the magnetic bubble of the nth layer is stably held at the position c in a manner that the bubble center is positioned on the line b-c in the close vicinity of the position c. Accordingly, by reversing the direction of the in-plane magnetic field to the direction +X, the magnetic bubble is moved to the position b and stably held there. To summarize, by reversing the direction of the in-plane magnetic field, the magnetic bubble of the nth layer is moved to the position a when the magnetic bubble of the (n−1)th layer is positioned at the position a, whereas the magnetic bubble of the nth layer is moved to the position b when the magnetic bubble of the (n−1)th layer is positioned at the position b, thus transmitting the information of the (n−1)th layer to the nth layer. By repeating the above mentioned function, the information is transferred from the uppermost magnetic layer to the second uppermost layer and to further lower magnetic layers one by one in turn. Also, it is possible to transfer the information from the lower magnetic layer to the upper magnetic layer in the same manner as mentioned above.

Figure 4:
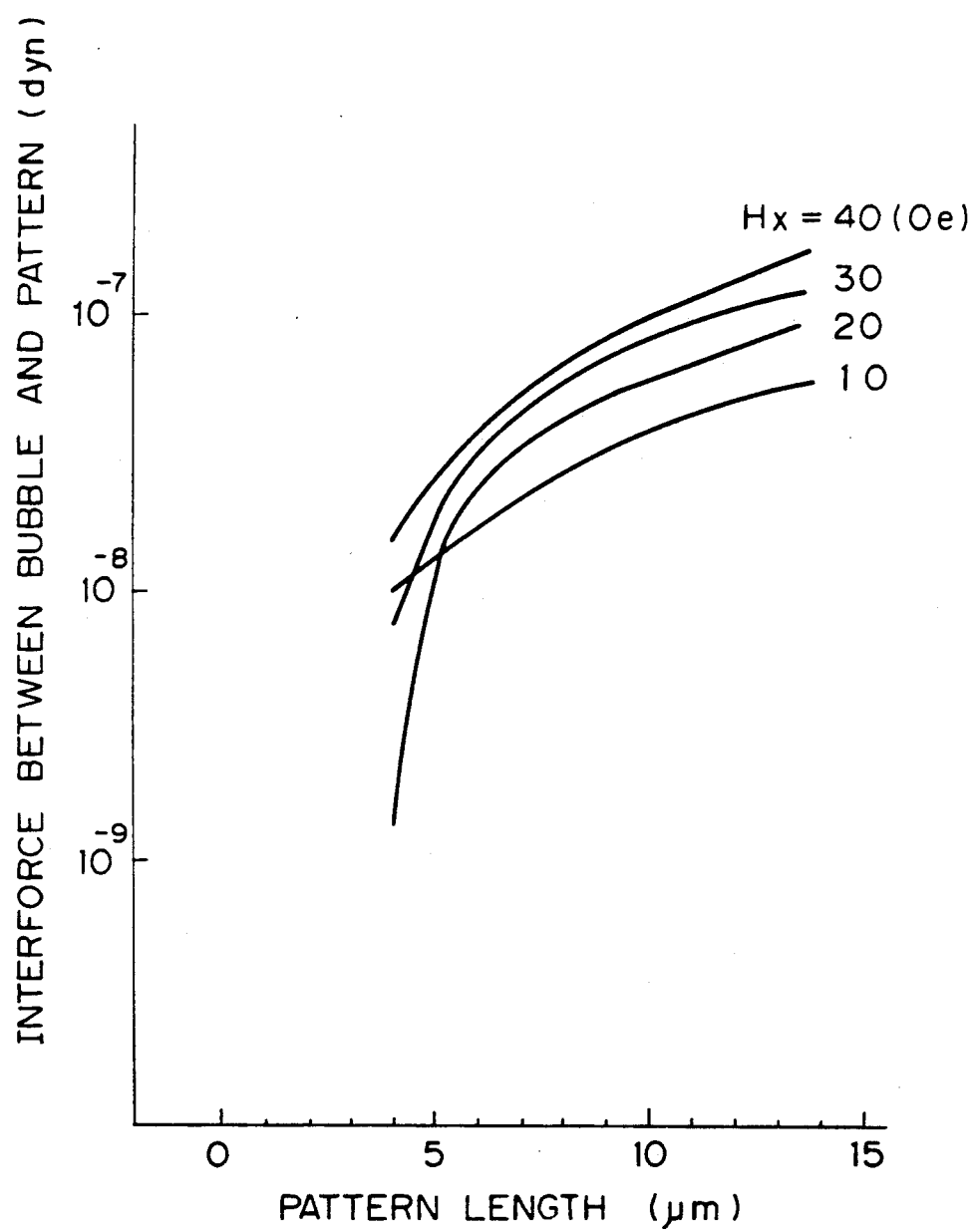
FIG. 4 is a graphical view for representing interforce acting between the magnetic bubble and the transfer pattern in relation to the length of the transfer pattern.

A simulation of transferring the bubble signal was conducted on the following condition. Interforce acting between the magnetic bubble and the transfer pattern in relation to the length of the transfer pattern is represented in FIG. 4. The represented interforce is a force which is applied to the magnetic bubble from the transfer pattern right after the reversing of the in-plane magnetic field. Note that the nonmagnetic layer thickness is assumed to be 1 $\mu$m in the simulation calculation. In connection with interfunction between the transfer pattern and the magnetic bubble in response to the in-plane magnetic field, taking FIG. 3(a) as an example, when the in-plane magnetic field is applied in the direction +X, the position c has the deepest potential well in comparison with the positions a and b, thus the magnetic bubble is stably held at the position c. On the other hand, when the in-plane magnetic field is applied in the direction −X, the potential well of the positions a and b becomes deeper than that of the position c, therefore the magnetic bubble being moved to the position a or b and stably held at the position. In accordance with the present invention, when the magnetic bubble of the upper magnetic layer or the lower magnetic layer of the magnetic layer of FIG. 3(a) is positioned at the position a, the magnetic bubble of the magnetic layer of FIG. 3(a) is moved to the position a, by applying the in-plane magnetic field in the direction −X. Also, in accordance with the present invention, the direction −X of the in-plane magnetic field is slightly shifted toward the line b-c from the bisector of angle $\alpha$ of the transfer pattern, so that the magnetic bubble can be moved to the position b which is the position of signal "0", when neither of the upper magnetic layer and the lower magnetic layer of the magnetic layer of FIG. 3(a) has the magnetic bubble at the position a.

Figure 5:
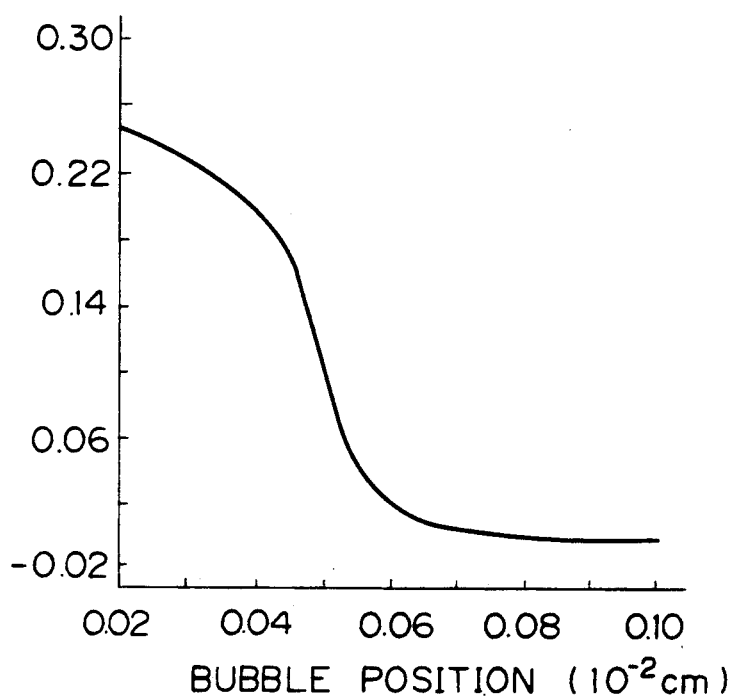
FIG. 5 is a graphical view for representing interforce acting between two bubbles arranged on each of different magnetic layers stacked together one above the other through a nonmagnetic layer disposed therebetween.

FIG. 5 graphically represents interfunction acting between two bubbles existing on the adjacent two magnetic layers, respectively, superposed together one above the other with a nonmagnetic layer disposed therebetween. Interforce acting between the two magnetic bubbles can be seen from the graph of FIG. 5. An appropriate distance between the magnetic bubbles can be determined from FIGS. 4 and 5.

Figure 6:
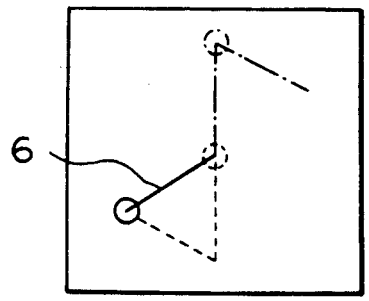
FIG. 6 is an explanatory view for explaining the transfer pattern seen from the upper side of the transfer area of FIG. 2, a layout of a pattern for writing data being additionally illustrated.

Condition of the Simulation:
Substrate: mono crystal of GGG
Magnetic layer: magnetic garnet film
Saturation magnetization Ms: 14.8 emu/cc
Vertical anisotropic coefficient Ku: 8520 erg/cc
Exchange stiffness coefficient: $2.07 \times 10^{-7}$ erg/cm
Radius of magnetic bubble: 3 $\mu$m FIG. 6 illustrates a magnetic bubble transfer area of FIG. 2 seen from the upper side thereof in which a guide line 6 for writing data signal is added to the first layer. In this drawing, the guide line 6 for writing data signal and the magnetic bubble of the first layer are depicted in a solid line. The transfer pattern and the magnetic bubble of the second layer are depicted in a dash-dot line and those of the third layer are depicted in a dash line, respectively. The first layer is stacked on the second layer through a nonmagnetic layer arranged between the two layers. The second layer as well as the layers therebelow is stacked in the same manner as the first layer.

Note that the guide line 6 is preferably arranged perpendicular to the direction of the in-plane magnetic field so that the magnetic bubble is not acted by a force due to the in-plane magnetic field along the line direction of the guide line 6. The guide line 6 is preferably formed simultaneously with the transfer pattern by the ion implantation method etc. as mentioned before. Also, it is possible to form a groove along the pattern by an ion milling method and to use this groove as the guide line.

A method for writing data signal in accordance with the present invention is described hereinafter. Writing data signal is carried out in a manner that signal "1" is written by transferring the magnetic bubble to the position "1" and signal "0" is written by transferring the magnetic bubble to the position "0".

Figure 7A:
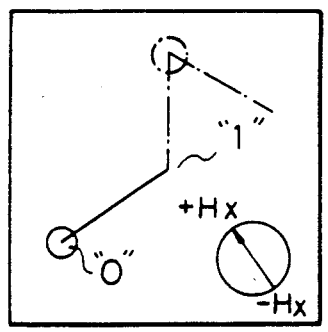
FIGS. 7(a) to 7(d) are explanatory views for explaining the function of the magnetic bubble at the time of writing information data signal by a laser irradiation method.
Figure 7B:
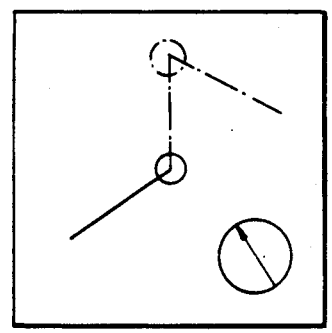
Figure 7C:
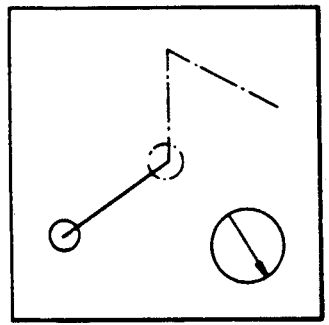
Figure 7D:
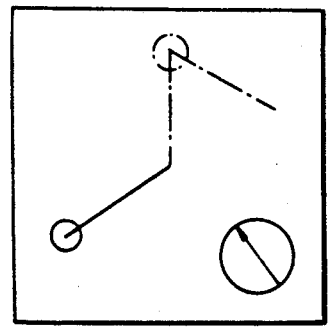
Figure 8:
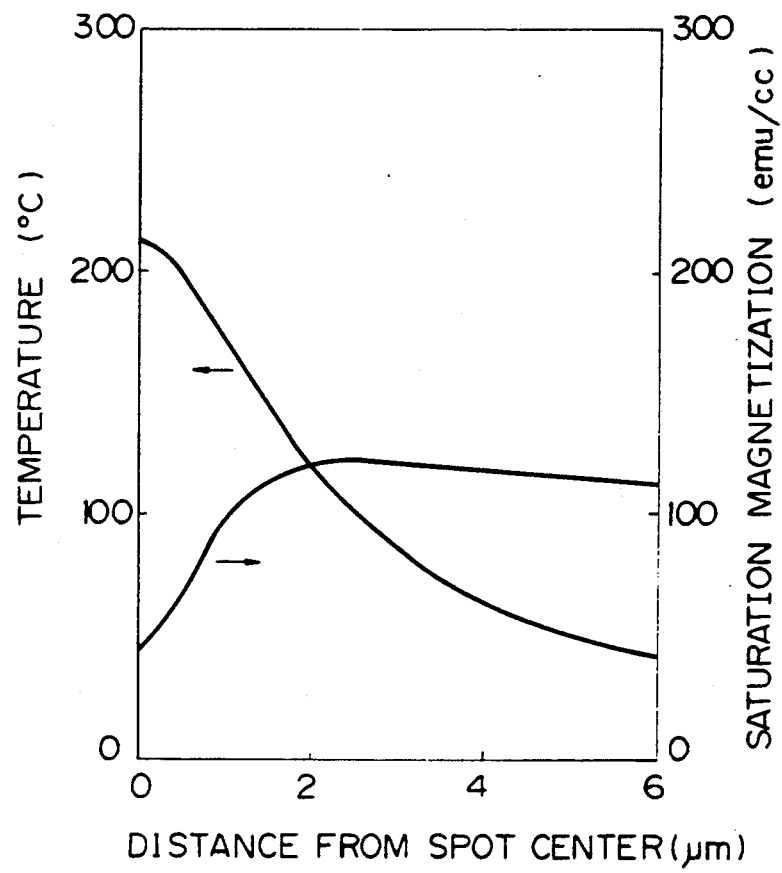
FIG. 8 is a graphical view for representing temperature and saturation magnetization of the magnetic layer in relation to the distance from a center of the laser irradiation spot.

FIGS. 7(a) to 7(d) represent a method for writing an information data signal by a laser irradiation method. In the drawings, a writing area of the first layer, a transfer area of the second layer and the magnetic bubbles of the two layers, respectively are represented. Also, the arrow in the circle represents the direction of the in-plane magnetic field. FIG. 7(a) represents a waiting state of the magnetic memory medium waiting for writing data signal in which state the in-plane magnetic field is applied in the direction +Hx and the magnetic bubble of the writing area of the first layer is assumed to be stably held at the position "0" for the sake of clear explanation. In the case wherein signal "1" is to be written, a single pulse laser spot is irradiated to the position "1" in the signal writing area of the first layer. By this operation, the portion at the position "1" is heated and magnetization at the position is reduced. FIG. 8 represents the relationship between the temperature and the saturation magnetization with respect to the distance from the center of the laser irradiation spot. As can be seen from the graph of FIG. 8, the magnetization at the position "1" is reduced by irradiating laser spot to the position so that the magnetic bubble is transferred from the position "0" to the position "1", thus reducing the distance to the magnetic bubble in the second layer. Accordingly, the magnetic bubble in the transfer pattern of the second layer is forced to move toward the position "1" due to the attraction force of the magnetic bubble of the first layer (FIG. 7(b)). In this state, the single pulse laser spot is irradiated to the position "0" in the writing area of the first layer simultaneously with reversing the in-plane magnetic field direction to the direction −Hx so that the magnetic bubble of the first layer returns to the position "0" and the magnetic bubble of the second layer is moved to the position "1" (FIG. 7(c)). After that, the in-plane magnetic field direction is again reversed to the direction +Hx so that the information signal data "1" of the second layer is transferred to the third layer and that the magnetic bubbles of the first layer and the second layer return to the initial position of the waiting state (FIG. 7(d)). In the manner mentioned above, the data signal "1" is written and transferred.

Figure 9A:
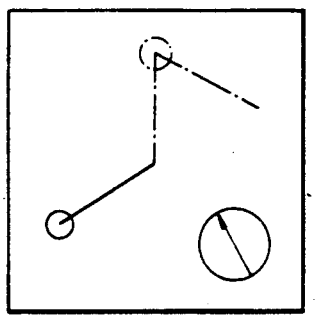
FIGS. 9(a) to 9(c) are further explanatory views for explaining the function of the magnetic bubble at the time of writing information data signal by a laser irradiation method.
Figure 9B:
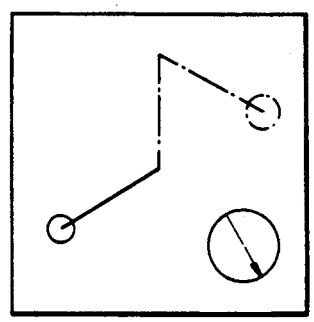
Figure 9C:
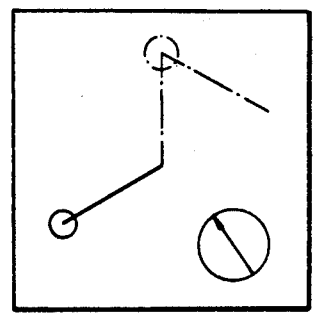

A method for writing data signal "0" is described hereinafter with reference to FIGS. 9(a) to 9(c). When signal "0" is to be written, the direction of the in-plane magnetic field is reversed to the direction −Hx from the initial waiting state wherein the in-plane magnetic field is applied in the direction +Hx (FIG. 9(a)), without irradiating the laser spot, that is without moving the magnetic bubble of the first layer. By simply reversing the in-plane magnetic field direction, the magnetic bubble of the second layer is moved to the position "0" (FIG. 9(b)) since the magnetic bubble of the first layer is not positioned at the position "1" thus the magnetic bubble of the first layer does not apply the attractive force to the magnetic bubble of the second layer. After that, the signal "0" is transferred to the lower layers in the same manner as in the case of transferring signal "1" as mentioned above. After that, the writing area returns to the initial waiting state (FIG. 9(c)).

Figure 10A:
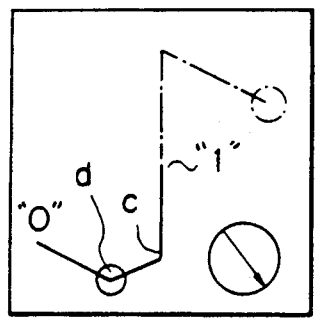
FIGS. 10(a) to 10(e) are still further explanatory views for explaining the function of the magnetic bubble at the time of writing information data signal by a laser irradiation method.
Figure 10B:
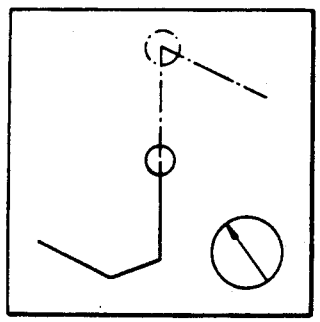
Figure 10C:
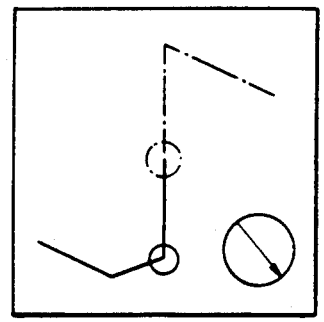
Figure 10D:
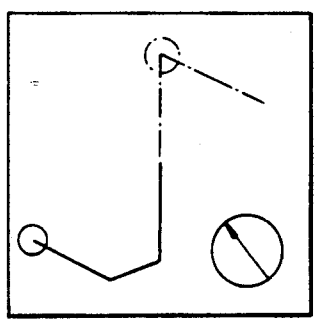
Figure 10E:
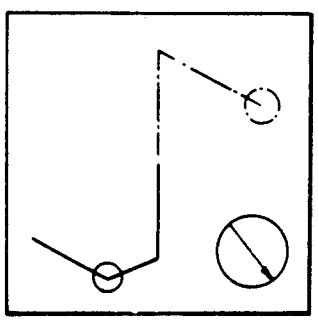

Another method for writing data signal in accordance with the present invention is described below. With this method, data signal is written without directly heating the positions "1" and "0". The magnetic layer arrangement of this embodiment is represented in FIGS. 10(a) to 10(e). Laser spot is irradiated at a position (c) or a position (d) in FIG. 10(a). FIG. 10(a) represents a state wherein the second layer has information signal "0". The guide line from the position "0" to the position "1" through the position (c) and the position (d) is formed by the same method as in the case of the aforementioned embodiment. When signal "1" is to be written from the state of FIG. 10(a), laser spot is irradiated to the position (c) so as to move the magnetic bubble to the position (c) then the in-plane magnetic field direction is reversed. With this operation, the magnetic bubble moved to the position (c) is acted by an interfunction from the magnetic pole of the magnetic guide line due to the function of the in-plane magnetic field so that the magnetic bubble is moved to the position "1" as illustrated in FIG. 10(b). After that, the in-plane magnetic field direction is again reversed to the direction −Hx, so that the magnetic bubble of the first layer is moved to the position (c) whereas the magnetic bubble of the second layer is moved to the position "1" due to the attractive force from the magnetic bubble of the first layer. If a further signal "1" is to be written from this state, the in-plane magnetic field direction is reversed without irradiating the laser spot. On the other hand, if a signal "0" is to be written from this state of FIG. 10(c) wherein the magnetic bubble of the first layer is positioned at the position (c) due to the function of the in-plane magnetic field in the direction −Hx, the laser spot is irradiated to the position (d) so as to move the magnetic bubble to the position (d). After that, the direction of the in-plane magnetic field is reversed to the direction +Hx (FIG. 10(d)). After that, the direction of the in-plane magnetic field is again reversed to the direction −Hx so that the magnetic bubble of the second layer is moved to the position "0", whereby signal "0" is written in the memory medium (FIG. 10(e)).

Figure 11:
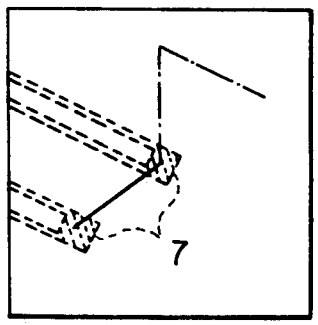
FIG. 11 is an explanatory view for explaining the function of the magnetic bubble at the time of writing information data signal by applying an electric current to a heating resistor element.

Instead of heating the prescribed position on the transfer pattern by irradiating the laser spot to the position so as to move the magnetic bubble to the heated position, as mentioned above, it is possible to heat the position of the transfer pattern by providing an electric heating resistor element at the position and applying an electric current to the resistor element. Timing of applying the electric current is the same as that of irradiating the laser spot as described above. An example of the heating resistor element arrangement is illustrated in FIG. 11. Numeral 7 designates a heating resistor element. Instead of moving the magnetic bubble by heating a part of the transfer pattern as mentioned above, it is possible to move the magnetic bubble of the first layer by an electric current with the use of a zigzag conductor which itself is known to be used in a major line of a conventional Bloch line memory type.

It is possible to arrange a magnetic bubble in the signal writing area at the time of creating the magnetic bubble for setting an initial state. Process for setting an initial state of the magnetic bubble is illustrated in FIGS. 12(a) to 12(c) and explained below with reference to the drawings.

Figure 12A:
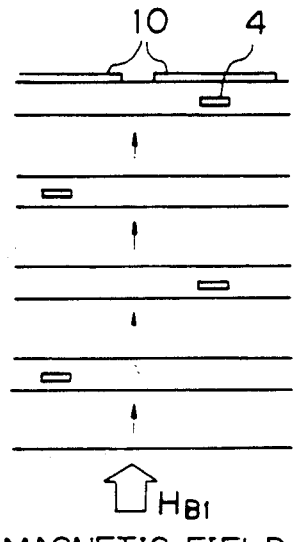
FIGS. 12(a) to 12(c) are explanatory views for explaining the process for setting an initial state of the magnetic memory medium in accordance with the present invention.
Figure 12B:
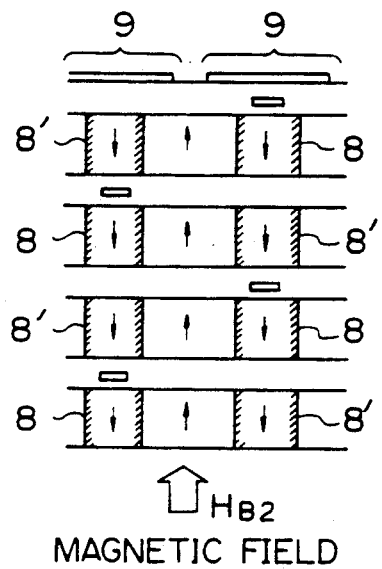

(1) A bias magnetic field $H_{B1}$ having magnitude more than saturation magnetization is applied to the memory medium so that the magnetization of the memory medium is completely oriented to one direction (FIG. 12(a)). Arrows in the drawing designate the direction of the magnetic field and magnetization.

(2) Then magnitude of the bias magnetic field is arranged to be $H_{B2}$ which is between a collapse magnetic field $H_{col}$ and a runout magnetic field $H_{run}$ so as to partly diminish the outer magnetic field of a small area 9 in the transfer area corresponding to the magnetic bubble writing area so that the magnitude of the outer magnetic field becomes below a magnetic field magnitude level of an anti-newcreation magnetic field. With this operation, the magnetization of the small area is reversed so that magnetic bubbles 8 and 8' are created in each magnetic layer in a manner that each magnetic bubble spans from an upper surface of the magnetic layer to a lower surface thereof (FIG. 12(b)).

Figure 12C:
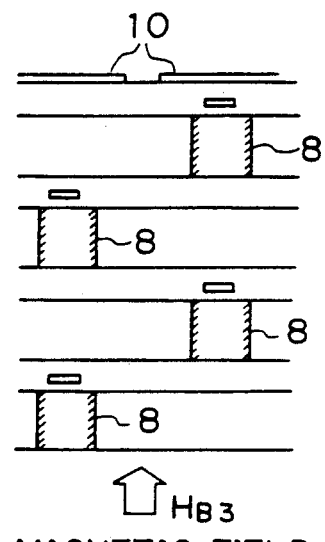

(3) After that, unnecessary magnetic bubbles 8' are eliminated so that magnetic bubbles 8 necessary for setting the initial state are remained in the magnetic layers (FIG. 12(c)).

The process for setting the initial state is further described in detail below.

Figure 13:
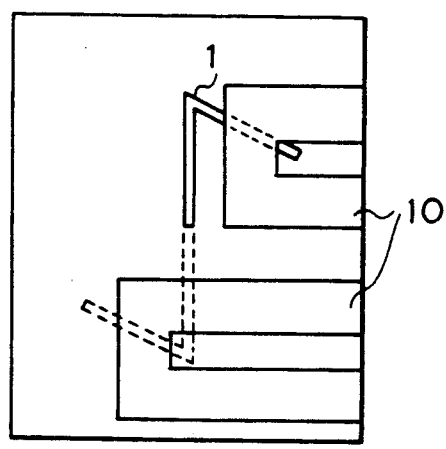
FIG. 13 is a plan view of the conductor pattern formed in the process of FIG. 12(a)

In connection with the above mentioned step (2), it is necessary to weaken the outer magnetic field of the small area in the transfer area below magnitude of the magnetic field which reverses magnetization direction. For this purpose, a conductor pattern 10 is prearranged on the upper surface of the layered magnetic memory medium for generating a partial magnetic field in the direction opposite to the direction of $H_{B2}$ (see FIG. 12(a) and FIG. 13). By running an electric current along the conductor pattern, the magnetization direction in the small area surrounded by the conductor pattern is reversed so that a magnetic bubble is created. In this case, the current is about 20 to 200 mA. In the manner mentioned above, magnetic bubbles are created superposedly in the stacked magnetic layers at an aligned position in the vertical direction so that the magnetic bubbles penetrate all of the stacked magnetic layers at the position. After that, unnecessary magnetic bubbles other than those necessary for setting the initial state are eliminated. In this case, the unnecessary magnetic bubbles are selectively eliminated on the basis of difference of the bubble collapse magnetic field due to whether the transfer pattern is presented at the position of the magnetic bubble or not. This is because the collapse magnetic field Hcol where the transfer pattern is presented is higher than the collapse magnetic field H'col where the transfer pattern is not presented by $\Delta H$. This relationship is represented by an equation Hcol=H'col+$\Delta H$. This phenomenon is due to creation of so called potential well. Therefore, by arranging the magnetic field magnitude as H'col<$H_{B3}$<Hcol, it is possible to selectively eliminate the magnetic bubbles on which the transfer pattern is not presented whereas remaining the magnetic bubbles on which the transfer pattern is presented.

Figure 14:
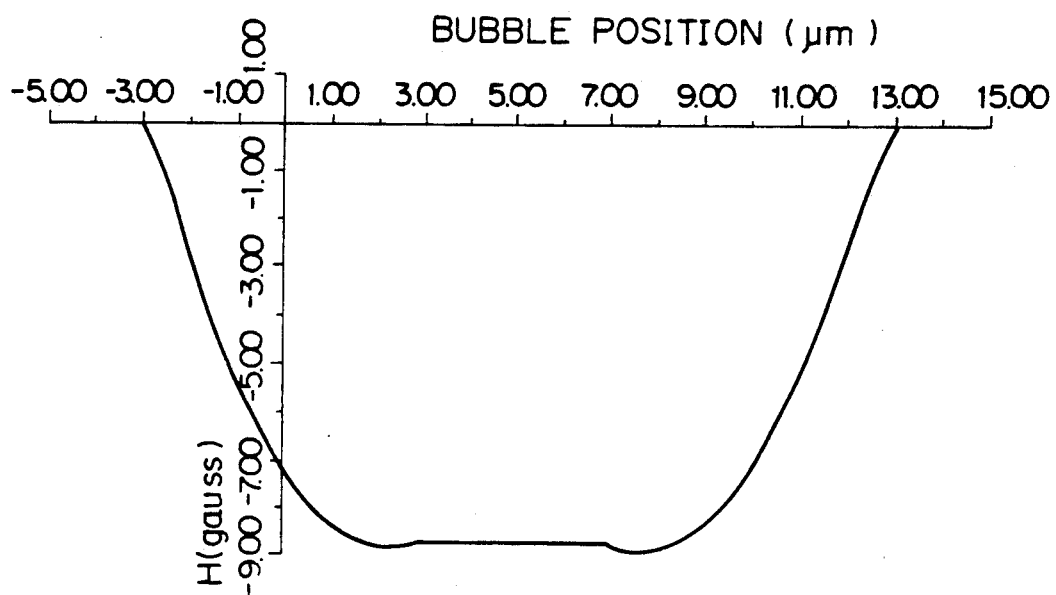
FIG. 14 is a graphical view for representing distribution of potential well on a strip shape transfer pattern of the magnetic memory medium in accordance with the present invention.
Figure 15:
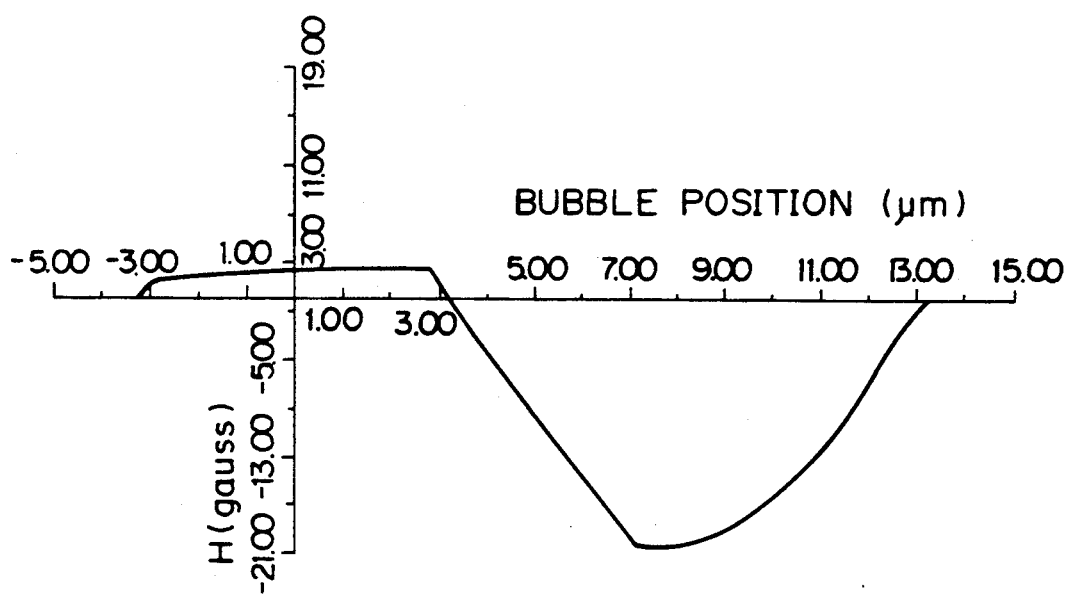
FIG. 15 is a graphical view for representing distribution of potential well which is presented at the time when the magnetic bubble is created in an initial state of the memory medium or eliminated under a condition that an in-plane magnetic field is applied to the memory medium of FIG. 14.
Figure 16:
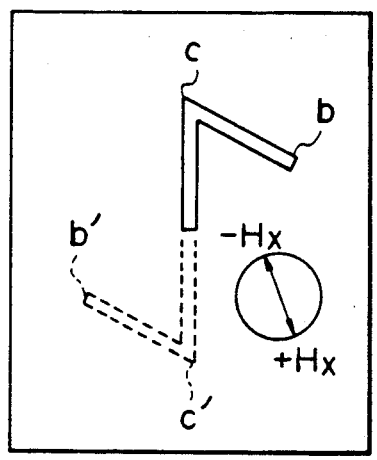
FIG. 16 is an explanatory view for explaining the position of the bubble at the time of creating the magnetic bubble in the initial state and at the time of eliminating the magnetic bubble on the condition of FIG. 15.

FIG. 14 is a graphical view of potential distribution of a memory medium having characteristics described below along a longitudinal direction of a strip shape transfer pattern thereof. In the graph, potential magnitude is represented by difference of amount H of the outer magnetic field which amount is changed in response to the potential magnitude. Note that in this graph, transfer pattern is assumed to be arranged on the magnetic memory medium in a portion which corresponds to a range between 0 to 10 $\mu m$ on the abscissa.
Saturation magnetization: 186 G
Anisotropy magnetic field: 1150 Oe
Film thickness: 2.01 $\mu m$
Exchange stiffness coefficient: $2.07 \times 10^{-7}$ erg/cm
Pattern dimension: 10 $\mu m$ (length)$\times$1 $\mu m$ (width)$\times$0.2 $\mu m$ (thickness)
Distance between Mg. Layer and Pattern: 0.2 $\mu m$ Actually, value of $\Delta H$ is slightly smaller than that represented in FIG. 14, since the magnetic bubble is influenced by the transfer pattern of the upper layer or the lower layer even if the layer in which the magnetic bubble is contained does not have a transfer pattern arranged at the position of the magnetic bubble. Note that it is possible to create and eliminate the magnetic bubble simultaneously with applying an in-plane magnetic field in order to increase the value of $\Delta H$. In this case, distribution of the potential well is represented by the graph of FIG. 15. Also, in this case, the magnetic bubble is created at a position b or c' for the in-plane magnetic field in the direction +Hx and at a position b' or c for the in-plane magnetic field in the direction -Hx.

The magnetic memory medium is arranged in an initial state in a manner mentioned above. After that, information data is written in this memory medium and the information data is transferred upward or downward through transfer patterns. The information data is read in a magnetic bubble reading area on the uppermost layer or the lowermost layer of the magnetic memory medium in which a major loop is formed by detecting the magnetic bubble or by a method described later. It is possible to obtain a memory medium having a further high density by arranging a signal joint area for constructing a minor loop on a surface layer (2nd layer to 4th layer and (N-2) th layer to Nth layer) of the magnetic layer in order to make a loop by combining a downward transfer area and an upward transfer area. Such a loop arrangement is described below.

Figure 17:
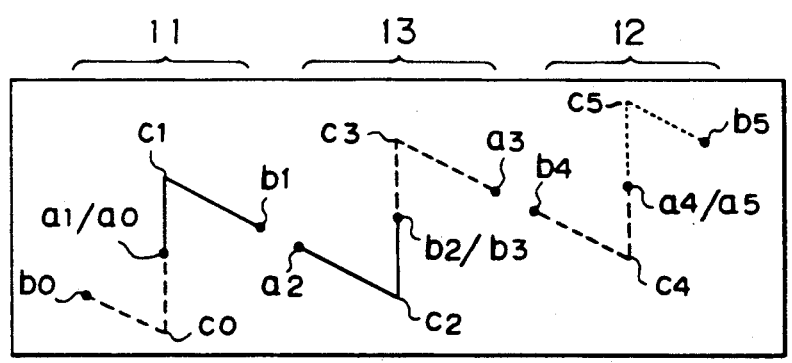
FIG. 17 is an explanatory view for explaining the constructional interrelation between the transfer patterns arranged in a zigzag loop arrangement in the magnetic layers superposed one above the other.

FIG. 17 represents a layout arrangement of a transfer pattern of a lower surface portion of the magnetic layer 2 including the lowermost layer (the (N-2) th layer to the Nth layer). In the drawing, numeral 11 designates a downward transfer area and numeral 12 designates an upward transfer area. A joint area 13 is arranged between the downward transfer area 11 and the upward transfer area 12. Note that FIG. 17 illustrates the magnetic layer of the lower layer portion. By arranging a joint area similar to the joint area 13 of FIG. 17 on the magnetic layer of the upper layer portion, it is possible to make a loop constituted from the upward transfer area 12 and the downward transfer area 11. A transfer pattern is formed in each of the transfer areas and the joint area, respectively. One magnetic bubble 5 exists in each transfer pattern. Also, a position (a) representing a signal "1" and a position (b) representing a signal "0" are predetermined. The positions (a) and (b) are interconnected through a position (c). When the magnetic bubble 5 is stably held in the position (a), the data signal "1" is memorized, whereas when the magnetic bubble 5 is stably held in the position (b), the data signal "0" is memorized. From this state, an in-plane magnetic field is applied to the magnetic layer to transfer the signal in the vertical direction. As an example, a method for transferring a signal transferred through the downward transfer area 11 to the upward transfer area 12 is described hereinafter with reference to FIG. 17 and FIGS. 18(a) to 18(d).

First, when the in-plane magnetic field is applied in the direction +X, if a signal "0" is transferred to the first layer of the downward transfer area 11, the magnetic bubble 5, is held at the position ($b_1$) in FIG. 17 and FIG. 18(a). In this state, a repulsive force represented in FIG. 23 acts on the magnetic bubble $5_2$ existing in the transfer pattern of the joint area 13 from the magnetic bubble stationed at the position ($b_1$) so that the magnetic bubble $5_2$ is stably held at a position on the line $b_2$-$c_2$ in the vicinity of the position ($c_2$) rather than on the line $a_2$-$c_2$ (FIG. 18(a)). Accordingly, when the in-plane magnetic field is reversed to the direction $-X$, the magnetic bubble $5_2$ is moved to the position ($b_2$) not to the position ($a_2$) as shown in FIG. 18(b). With this reversal of the magnetic field direction, the magnetic bubble $5_3$ existing in the transfer pattern of the second layer of the joint area is moved to the position ($c_3$). In general, a magnetic repulsive force is generated between the bubbles existing in the same plane, whereas a magnetic attractive force is generated between the bubbles existing in the different magnetic layers superposed one above the other. Therefore, an attractive force is applied to the magnetic bubble $5_3$ from the magnetic bubble $5_2$ stationed at the position ($b_2$) so that the magnetic bubble $5_3$ is stably held at a position on the line $c_3$-$b_3$ in the vicinity of the position ($c_3$). After that, the in-plane magnetic field is again reversed to the direction $+X$, so that the magnetic bubble $5_3$ is moved to the position $b_3$. The magnetic repulsive interforce generated between the magnetic bubble $5_3$ and the magnetic bubble $5_4$ moved to the position ($c_4$) of the upward transfer area is not influentially strong since the magnetic bubbles $5_3$ and $5_4$ are too remote from each other to move the magnetic bubble $5_4$ away from the position ($c_4$), so that the magnetic bubble $5_4$ is positioned there (FIG. 18(c)). After that, the in-plane magnetic field is reversed to the direction $-X$ so that the magnetic bubble $5_4$ is moved to the position ($b_4$) as shown in FIG. 18(d). In a manner mentioned above, the signal "0" at the position ($b_1$) of the downward transfer area is transferred to the position "0" of the upward transfer area.

Also, signal "1" is transferred in the same manner as signal "0" due to the magnetic interfunction as illustrated in FIGS. 19(a) to 19(d).

Note that in FIGS. 18(a) to 18(d) and FIGS. 19(a) to 19(d), magnetic bubbles other than those concerned with the transferring function are not shown for the sake of clarification of the drawings.

With regard to the transferring of the magnetic bubble in the thickness direction that is in the vertical direction in the downward transferring area and in the upward transferring area, the magnetic bubble is transferred from a magnetic layer to an adjacent upper magnetic layer or to an adjacent lower magnetic layer, one layer by one layer, due to the magnetic interfunction generated between the magnetic bubbles in the adjacent two magnetic layers, respectively, at the position where the transfer patterns of the upper magnetic layer and the lower magnetic layer, respectively, are partly superposed together one above the other.

As mentioned above, the downward transfer area and the upward transfer area are connected together through the joint area to make a minor loop so that the magnetic bubble is repeatedly transferred downward, upward, again downward and so on for desired necessary times. Note that the loop in the vertical direction includes a closed loop and an open loop in which the information data signal is transferred in a zigzag movement repeating upward transfer movement and downward transfer movement.

Figure 20:
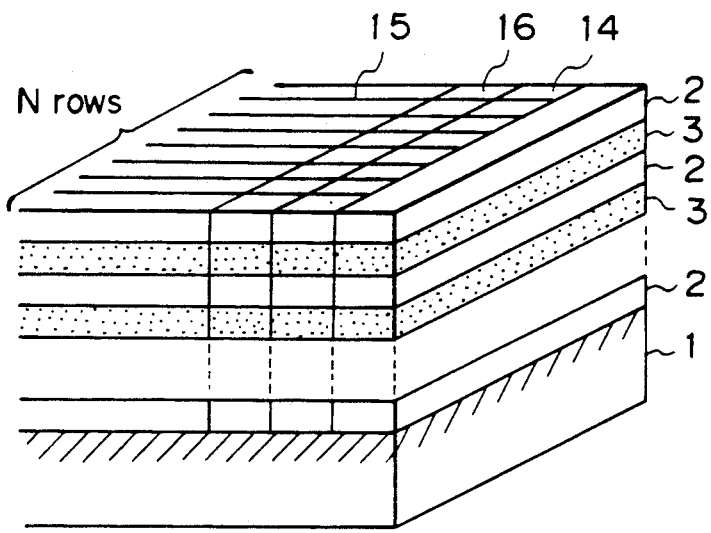
FIG. 20 is a constructional view of the magnetic memory medium of FIG. 1 in which an information data signal in the vertical transfer area is transferred to the in-plane transfer area through a joint area.

FIG. 20 illustrates another embodiment of the magnetic memory medium in accordance with the present invention in which the joint area is provided. In the drawing, numeral 14 designates a vertical transfer area, numeral 15 designates an in-plane transfer area and numeral 16 designates a joint area disposed between the vertical transfer area 14 and the in-plane transfer area 15. The bubble transferring area comprising the three transfer areas 14, 15 and 16 is arranged side by side in a structure of a plurality of rows (N rows in FIG. 20) in the memory medium. The vertical transfer area is so constructed that an information data signal is transferred in the vertical direction by a magnetic bubble which moves between a position "1" and a position "0" in a transfer pattern of each magnetic layer. Also, the information data signal is transferred in the in-plane transfer area 15 in which the magnetic bubble is moved along and on a transfer pattern which is known per se. The joint area 16 is so constructed that the information data signal in the vertical transfer area 14 in any magnetic layer is transferred to the in-plane transfer area 15 due to the signal transferring function of the magnetic bubble. An example of the signal transferring function of the magnetic bubble in the joint area 16 is described below with reference to FIGS. 21(a) and 21(b) and FIGS. 22(a) to 22(d).

Figure 21A:
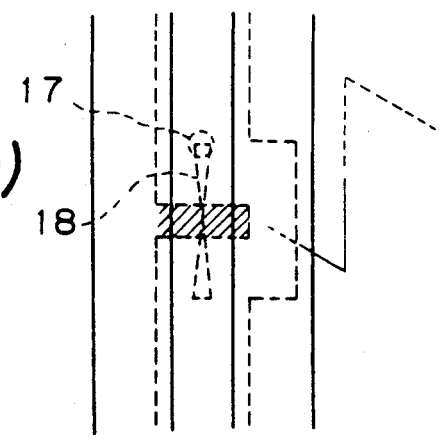
FIGS. 21(a) and 21(b) are constructional views of the joint area of FIG. 20.
Figure 21B:
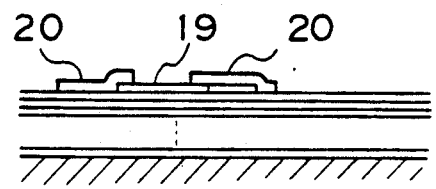

As illustrated in FIGS. 21(a) and 21(b), the joint area 16 includes a species bubble 17 which is arranged in each of the magnetic layer and comprises a soft magnetic guide line pattern 18 for guiding the species bubble 17, a bubble chopping conductor 19 for chopping the magnetic bubble formed on an uppermost layer of the memory medium and a bubble stretching conductor 20 for stretching the magnetic bubble formed also on the uppermost layer of the memory medium. The soft magnetic guide line pattern 18 for guiding the species bubble can be formed by a method utilizing contact photolithography technique or by a method of ion implantation. It is desirable to use permalloy (Fe-Ni alloy) as the material of the soft magnetic guide line pattern. The length of the guide line pattern is preferably twice to ten times of the diameter D of the species bubble 17. Also, it is preferable that the guide line pattern has a shape which is thinned at around a center thereof in the longitudinal direction thereof and widened at the both ends thereof, as illustrated in FIGS. 22(a) to 22(d), so that a potential well is made at the end of the pattern.

With the above mentioned construction of the joint area 16, in a state in which a magnetic bubble exists at a position of signal "1" (position (a)) of the vertical transfer area 14, that is in the state in which a signal "1" is transferred and there is no bubble at the position "0", a pulse current Ist is applied to the species bubble stretching conductor 20 so that the species bubble 17 is stretched along the soft magnetic guide line pattern 18 due to the partial magnetic field Hst which is applied in the direction opposite to the bias magnetic field Hb and which is generated partially in a portion surrounded by the species bubble stretching conductor 20. With this operation, the shape of the species bubble 17 changes as illustrated from FIG. 22(a) to FIG. 22(b). In this state of FIG. 22(b), a pulse current Ich is applied to the bubble chopping conductor 19 so that the magnetic bubble 17 is divided to two parts, as illustrated in FIG. 22(c), due to the partial magnetic field Hch which is applied in the same direction as the bias magnetic field Hb and which is generated partially in a small area (shadowed portion in FIG. 21(a)) surrounded by the bubble chopping conductor 19. After that, the pulse current Ist and the pulse current Ich are terned off simultaneously or in order of Ist and Ich so that the separated two magnetic bubbles 21 and 22 are positioned at the both ends of the magnetic guide line pattern 18, respectively, as illustrated in FIG. 22(d). One of the two magnetic bubbles 21 is used as a species magnetic bubble functioning as described above in a subsequent signal transmitting operation, whereas the other of the two magnetic bubbles 22 is transferred to the in-plane transfer area 15 as an in-plane transfer signal "1". In the manner mentioned above, the information data signal "1" is transferred from the vertical transfer area 14 to the in-plane transfer area 15.

Information data signal "0" transferred to the vertical transfer area 14 is processed as described below. In this case, a magnetic repulsive interforce is generated between the species bubble 17 and the magnetic bubble 5 which is moved to and stationed at the position "0" of the vertical transfer area 14 (see FIG. 23). Therefore, the species bubble 17 is prevented from being stretched beyond the bubble chopping conductor 19 even when the magnetic field Hst is applied thereto. Accordingly, the species bubble 17 is not divided even if the magnetic field Hch is applied thereafter to the magnetic bubble chopping conductor 19. Thus, the magnetic bubble is not transferred to the in-plane transfer area 15, which means that the information data signal "0" is transferred.

In accordance with the aforementioned functional principle, the information data signal of the vertical transfer area 14 is transferred to the in-plane transfer area 15 through the joint area 16. And after that, the magnetic bubble is transferred from the vertical transfer area 14 to the in-plane transfer area 15 through the joint area 16 so that a three dimensional magnetic memory medium is arranged.

Finally, the information data signal is read by detecting the presence or absence of the magnetic bubble in a magnetic bubble reading area comprising a major loop which is not shown.

Another example of the function of reading the information data signal is described below.

Figure 24:
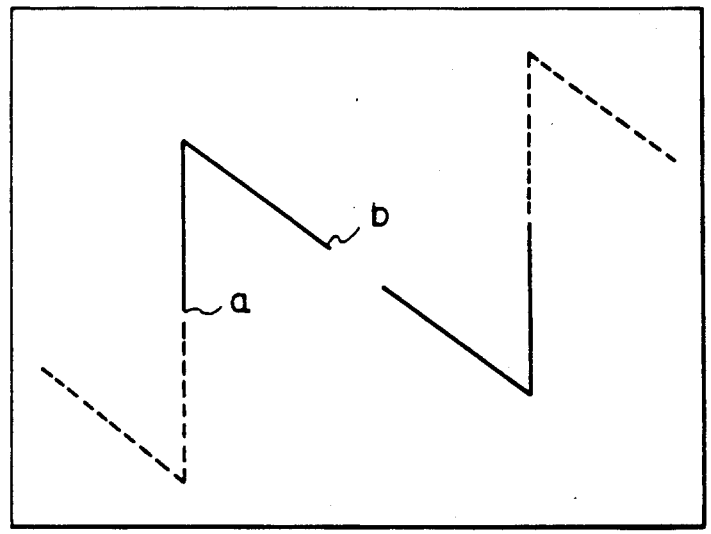
FIG. 24 is an explanatory view for explaining the transfer pattern structure of the uppermost magnetic layer having a transfer area formed in the zigzag loop arrangement.
Figure 24:
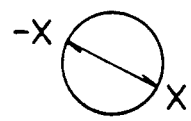
Figure 25:
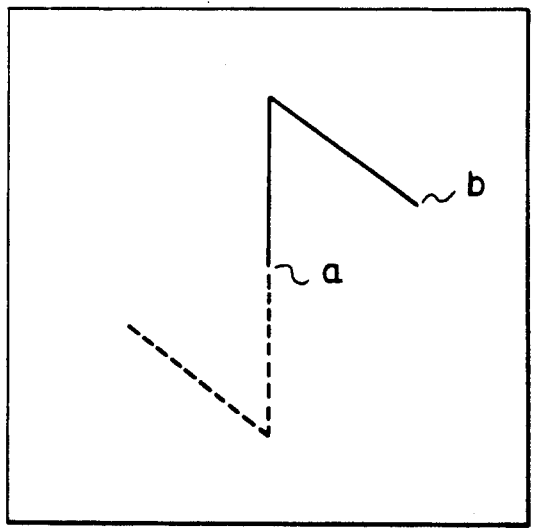
FIG. 25 is an explanatory view for explaining the structure of the uppermost magnetic layer having a transfer area formed in a folded line.
Figure 25:
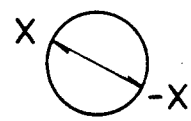

FIG. 24 illustrates a layout of transfer patterns on the uppermost magnetic layer (the Nth layer) of the memory medium in which the transfer portion is arranged as a loop structure as mentioned above. On the other hand, FIG. 25 illustrates a layout of the uppermost Nth layer of the magnetic memory medium in which the transfer portion is arranged as a line structure. The structure of FIG. 24 or FIG. 25 is selected according to the information data signal recording process to be adopted. The structure of FIG. 24 is selected in a case wherein the structure is used as a minor loop in which the information data signal is directly recorded in the transfer area. On the other hand, the structure of FIG. 25 is selected in a case wherein the structure is used as a major loop in which the information data signal is transferred between minor loops each of which is independently arranged in each of the magnetic layers in a manner similar to the conventional minor loop of the magnetic memory medium. The magnetic bubble in the Nth layer is moved to the position (a) or (b) by switching the in-plane magnetic field from the direction +X to the direction −X or vice versa according to the transferred signal. Therefore, it is possible to read the information data signal by a photo-magnetic detector which is disposed in the vicinity of the position (a) or (b) by detecting change of luminous intensity when the signal "1" or "0" is transferred thereto.

Figure 26:
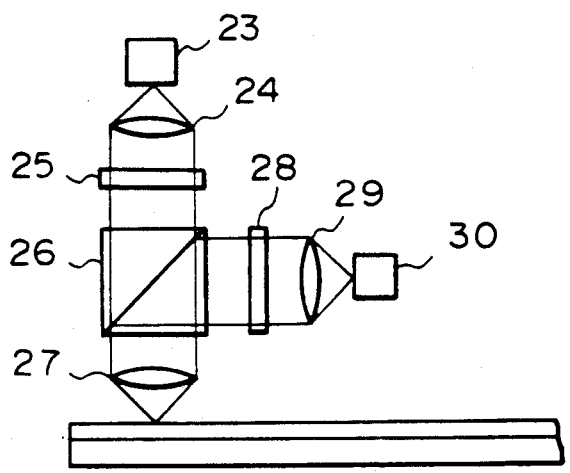
FIG. 26 is a constructional view of a detector for reading the information data signal.

An example of the photo-magnetic detector is schematically illustrated in FIG. 26. In the drawing are depicted a light source 23, a collimate lens 24, a polarizer plate 25, a polarization beam splitter 26, a condenser lens 27, an analyzer 28, a collimate lens 29 and a photo detector 30. Diverging light emitted from the light source 23 is collimate through the collimate lens 24 and polarized into linear polarization through the polarizer plate 25. The polarized light then passes through the polarization beam splitter 26 and the condenser lens 27 to irradiate the position (a) or (b) of the first layer. Rotational direction of the photo-magnetic function is different according as the magnetic bubble is presented or not at the position. Therefore, luminous intensity of the light reflected from the magnetic layer surface is changed after passing through the collimate lens 27, the polarization beam splitter 26 and the analyzer 28 in accordance with presence or absence of the magnetic bubble at the position where the laser spot is irradiated and reflected. The reflection light is then introduced into the photo detector 30 through the collimate lens 29, thereby presence or absence of the magnetic bubble is detected in response to the luminous intensity change. In order to increase the reliability of the above mentioned magnetic bubble detector, it is desirable to use a material having a large Kerr effect as the magnetic layer. For example, it is preferable to use an amorphous alloy of a rare earth transition metal such as an alloy of GdFe group or GdCo group as the magnetic layer. Also, it is possible to use a rare earth garnet film as used in the conventional magnetic bubble memory device. When the rare earth garnet film is used as the magnetic layer, it is necessary to dispose a reflection layer between the first magnetic layer and the second magnetic layer to detect the reflection light on the basis of Faraday effect, since the film is transparent with respect to the semiconductor laser having a wavelength between 780 nm and 833 nm which wavelength is used in general as the laser.

Also, it is possible to construct the detector means with the use of a photo integrated circuit comprising photo waveguide lines formed on a chip. With this structure, it becomes possible to heighten the speed of reading the information data signal and make the memory device small and compact.

Figure 27:
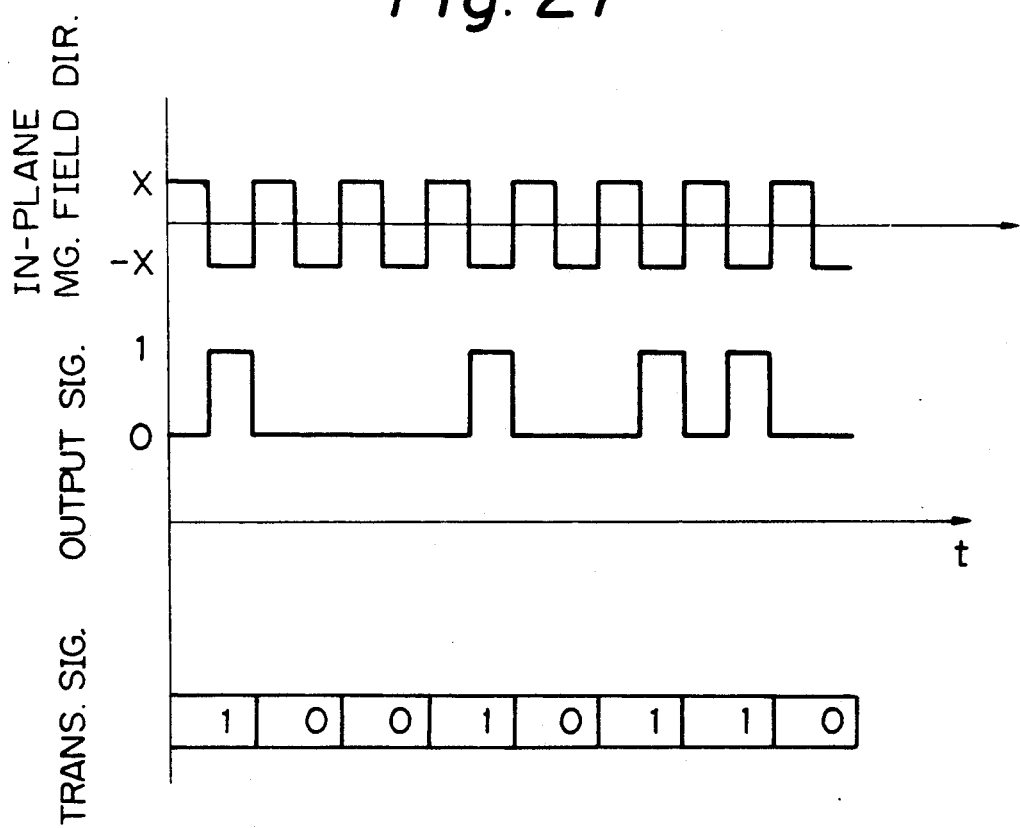
FIG. 27 is a graphical view for representing relationship between the in-plane magnetic field direction and the output signal of the detector for detecting the magnetic bubble in response to the information data signal to be transferred.

FIG. 27 represents an output signal of the above mentioned detector along with the timing of changing the in-plane magnetic field direction, in the case where a signal code "10010110" is to be transmitted.

Many widely different embodiments of the present invention may be constructed without departing from the spirit and scope of the present invention. It should be understood that the present invention is not limited to the specific embodiments described in the specification, except as defined in the appended claims.

What is claimed is:

1. A three-dimensional magnetic memory medium for storing signals having a first state and a second state, comprising:
   a substrate;
   a plurality of nonmagnetic layers;
   a plurality of magnetic layers having respectively magnetic bubbles, said magnetic layers including first type magnetic layers each having a first transfer pattern for guiding one of said magnetic bubbles transferred by applying an in-plane magnetic field and second type magnetic layers each having a second transfer pattern different from said first transfer pattern for guiding another one of said magnetic bubbles transferred by applying said in-plane magnetic field, said first type magnetic layers and said second type magnetic layers being stacked alternately one above the other on said substrate through respective ones of said nonmagnetic layers, each of said first transfer pattern and said second transfer pattern having a first stable position corresponding to said first state, a second stable position corresponding to said second state and a third stable position between said first stable position and said second stable position, said first positions, said second positions and said third positions of respective magnetic layers being arranged in such a manner that first stable positions of respective magnetic layers are superposed on each other and in such a manner that one magnetic bubble of one magnetic layer is affected by another magnetic bubble of an adjacent magnetic layer on the condition that said one magnetic bubble and said another magnetic bubble are respectively located in the third position of said one magnetic layer and in the first position of said adjacent magnetic layer, while said one magnetic bubble is not affected by said another magnetic bubble on the condition that said one magnetic bubble and said another magnetic bubble are respectively located in the third position of said one magnetic layer and in the second position of said adjacent magnetic layer, so that said signals are transferred vertically between magnetic layers according to alternating a direction of said in-plane magnetic field; and a top magnetic layer disposed on an uppermost layer of said magnetic layers for writing said signals into the three dimensional magnetic memory medium, having a magnetic bubble, and a third transfer pattern which includes a first stable position being superposed on a first position of the uppermost magnetic layer, a second stable position and guide line for guiding a transfer of said magnetic bubble of the top magnetic layer between said first position and said second position in said top magnetic layer.

2. A three-dimensional magnetic memory medium according to claim 1, wherein a magnetic bubble in said first transfer pattern is stably located at one of said first and second stable positions and a magnetic bubble in said second transfer pattern is stably located at said third stable position under one direction of said in-plane magnetic field, and said magnetic bubble in said first transfer pattern is stably located at said third position and said magnetic bubble in said second transfer pattern is stably located at one of said first and second stable positions under the opposite direction of said in-plane magnetic field.

3. A three-dimensional magnetic memory medium according to claim 1, wherein a magnetic bubble located in a first stable position of one magnetic layer attracts another magnetic bubble located in a third stable position of an adjacent magnetic layer.

4. A three-dimensional magnetic memory medium according to claim 1, wherein a magnetic bubble is actuated to move between said first position and said second position in said top magnetic layer by irradiating a laser spot.

5. A three-dimensional magnetic memory medium according to claim 1, wherein a magnetic bubble is actuated to move between said first position and said second position in said top magnetic layer by applying an electric current to a heating resistor element disposed on said top magnetic layer.

6. A three-dimensional magnetic memory medium according to claim 1, wherein a magnetic bubble is actuated to move between said first position and said second position in said top magnetic layer by applying an electric current to a zigzag conductor.

7. A three-dimensional magnetic memory medium according to claim 1, wherein each of said top magnetic layer and a lowermost magnetic layer comprises a signal joint area which constitutes a minor loop for making a loop arrangement constructed by a downward signal transfer area and an upward signal transfer area.

8. A three-dimensional magnetic memory medium according to claim 1, wherein each of said magnetic layers comprises a vertical signal transfer area, an in-plane signal transfer area and a signal joint area disposed between said vertical signal transfer area and said in-plane signal transfer area, wherein a species bubble is arranged in said signal joint area which comprises a soft magnetic pattern used as a guide line for guiding said species bubble, and wherein an uppermost structure of said memory medium comprises a bubble chopping conductor and a bubble stretching conductor.

9. A three-dimensional magnetic memory medium according to claim 1, wherein there is a magnetic bubble detector for detecting said magnetic bubble at one of first and second positions in said third transfer pattern of the top magnetic layer to read said signal.

10. A three-dimensional magnetic memory medium according to claim 1, wherein a magnetic bubble detector is constructed to detect said magnetic bubble due to photo magnetic effect.

11. A method for setting an initial state of a three-dimensional magnetic memory medium for storing signals having a first state and a second state, said memory medium comprising:

a substrate;

a plurality of nonmagnetic layers;

a plurality of magnetic layers having respectively magnetic bubbles, said magnetic layers including first type magnetic layers each having a first transfer pattern for guiding one of said magnetic bubbles transferred by applying an in-plane magnetic field and second type magnetic layers each having a second transfer pattern different from said first transfer pattern for guiding another one of said magnetic bubbles transferred by applying said in-plane magnetic field, said first type magnetic layers and said second type magnetic layers being stacked alternately one above the other on said substrate through respective ones of said nonmagnetic layers, each of said first transfer pattern and said second transfer pattern having
- a first stable position corresponding to said first state,
- a second stable position corresponding to said second state,
- a third stable position between said first stable position and said second stable position,
- said first positions, said second positions and said third positions of respective magnetic layers being arranged in such a manner that first stable positions of respective magnetic layers are superposed on each other and in such a manner that one magnetic bubble of one magnetic layer is affected by another magnetic bubble of an adjacent magnetic layer on the condition that said one magnetic bubble and said another magnetic bubble are respectively located in the third position of said one magnetic layer and in the first position of said adjacent magnetic layer, while said one magnetic bubble is not affected by said another magnetic bubble on the condition that said one magnetic bubble and said another magnetic bubble are respectively located in the third position of said one magnetic layer and in the second position of said adjacent magnetic layer, so that said signals are transferred vertically between magnetic layers according to alternating a direction of said in-plane magnetic field; and a top magnetic layer disposed on an uppermost layer of said magnetic layers for writing said signals into the three dimensional magnetic memory medium, having
- a magnetic bubble, and
- a third transfer pattern which includes a first stable position being superposed on a first position of the uppermost magnetic layer, a second stable position and a guide line for guiding a transfer of said magnetic bubble of the top magnetic layer between said first position and said second position in said top magnetic layer, said method comprising the steps of:
(1) creating magnetic bubbles at a time in vertically superposed small area in all of said magnetic layers; and
(2) selectively eliminating unnecessary magnetic bubbles created in said small areas in step (1).

* * * * *

UNITED STATES PATENT AND TRADEMARK OFFICE
CERTIFICATE OF CORRECTION

PATENT NO. : 5,103,422
DATED : April 7, 1992
INVENTOR(S) : Toshiaki Tokita, et al It is certified that error appears in the above-indentified patent and that said Letters Patent is hereby corrected as shown below:

On the title page:

Left-hand column, item [73], change "Compnay" to
-- Company --.

Signed and Sealed this

Twenty-ninth Day of June, 1993

Attest:

MICHAEL K. KIRK

Attesting Officer

Acting Commissioner of Patents and Trademarks